United States Patent
Lee et al.

(10) Patent No.: US 9,711,746 B2
(45) Date of Patent: Jul. 18, 2017

(54) ORGANIC LIGHT EMITTING DIODE DISPLAY HAVING AN ORGANIC LAYER THAT INCLUDES LAYERS OF VARIED THICKNESSES

(71) Applicant: SAMSUNG DISPLAY CO., LTD., Yongin, Gyeonggi-Do (KR)

(72) Inventors: Changmin Lee, Hwaseong-si (KR); Hyunju Choi, Seoul (KR); Jihwan Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/692,638

(22) Filed: Apr. 21, 2015

(65) Prior Publication Data

US 2016/0133674 A1 May 12, 2016

(30) Foreign Application Priority Data

Nov. 7, 2014 (KR) .......................... 10-2014-0154601

(51) Int. Cl.
 *H01L 51/50* (2006.01)
 *H01L 27/32* (2006.01)
 *H01L 51/52* (2006.01)

(52) U.S. Cl.
CPC ...... *H01L 51/5036* (2013.01); *H01L 27/3206* (2013.01); *H01L 27/3211* (2013.01);
(Continued)

(58) Field of Classification Search
CPC ............. H01L 27/3206; H01L 27/3211; H01L 27/3216; H01L 27/3218; H01L 51/5024;
(Continued)

(56) References Cited

U.S. PATENT DOCUMENTS 7,075,161 B2 * 7/2006 Barth ................ G01N 33/48721
257/414
8,324,699 B2 * 12/2012 Ichijo ...................... C23C 16/02
257/228
(Continued)

FOREIGN PATENT DOCUMENTS

KR 10-2008-0020509 A 3/2008
KR 10-2011-0067139 A 6/2011
KR 10-2013-0030842 A 3/2013

OTHER PUBLICATIONS

Definition of Correspond. (n.d.) American Heritage® Dictionary of the English Language, Fifth Edition. (2011). Retrieved Aug. 12, 2016 from http://www.thefreedictionary.com/correspond.*
(Continued)

*Primary Examiner* — Michael Jung
(74) *Attorney, Agent, or Firm* — Lewis Roca Rothgerber Christie LLP (57) ABSTRACT

An organic light emitting diode display includes: a substrate; and a plurality of red organic light emitting diodes, green organic light emitting diodes, and blue organic light emitting diodes on the substrate, each of the plurality of red organic light emitting diodes, green organic light emitting diodes, and blue organic light emitting diodes including: a first electrode on the substrate; an organic layer on the first electrode; and a second electrode on the organic layer, and the organic layer includes a light emission auxiliary layer on the first electrode and an organic light emitting layer on the light emission auxiliary layer, and the organic layer of each of the red organic light emitting diodes has a thickness of about 90 to 110 nm.

19 Claims, 5 Drawing Sheets

(52) U.S. Cl.
CPC ...... *H01L 27/3216* (2013.01); *H01L 27/3218* (2013.01); *H01L 27/3244* (2013.01); *H01L 51/504* (2013.01); *H01L 51/5012* (2013.01); *H01L 51/5024* (2013.01); *H01L 51/5064* (2013.01); *H01L 51/5265* (2013.01); *H01L 27/3209* (2013.01); *H01L 51/5056* (2013.01); *H01L 51/5072* (2013.01); *H01L 51/5088* (2013.01); *H01L 51/5092* (2013.01); *H01L 2251/558* (2013.01)

(58) Field of Classification Search
CPC  H01L 51/5036; H01L 51/504; H01L 27/3209
See application file for complete search history.

(56) References Cited

U.S. PATENT DOCUMENTS

| | | | |
|---|---|---|---|
| 8,426,728 B2* | 4/2013 | Zhao | ............ H01L 51/4226 136/260 |
| 2005/0037232 A1 | 2/2005 | Tyan et al. | |
| 2008/0054797 A1 | 3/2008 | Furugori | |
| 2009/0026921 A1 | 1/2009 | Kuma et al. | |
| 2011/0140139 A1 | 6/2011 | Jeong et al. | |
| 2011/0297977 A1* | 12/2011 | Kajimoto | ............ H01L 27/3206 257/89 |
| 2012/0138975 A1 | 6/2012 | Yoshioka et al. | |
| 2013/0168652 A1* | 7/2013 | Nam | ................ H01L 51/50 257/40 |
| 2013/0207138 A1 | 8/2013 | Kashiwabara et al. | |
| 2014/0117315 A1* | 5/2014 | Kim | ................ H01L 51/0001 257/40 |
| 2014/0151658 A1* | 6/2014 | Lee | ................ H01L 51/5012 257/40 |
| 2014/0167013 A1* | 6/2014 | Lee | ................ H01L 51/56 257/40 |
| 2014/0183493 A1* | 7/2014 | Lee | ................ H01L 51/56 257/40 |
| 2015/0187848 A1* | 7/2015 | Kim | ................ H01L 51/5064 257/40 |
| 2015/0188075 A1* | 7/2015 | Kim | ................ H01L 51/5064 257/40 |
| 2015/0194471 A1* | 7/2015 | Lee | ................ H01L 51/5218 257/40 |

OTHER PUBLICATIONS

EPO Search Report dated Mar. 29, 2016, for corresponding European Patent application 15173386.2, (9 pages).

* cited by examiner

ORGANIC LIGHT EMITTING DIODE DISPLAY HAVING AN ORGANIC LAYER THAT INCLUDES LAYERS OF VARIED THICKNESSES

CROSS-REFERENCE TO RELATED APPLICATION

This application claims priority to and the benefit of Korean Patent Application No. 10-2014-0154601, filed on Nov. 7, 2014, with the Korean Intellectual Property Office, the disclosure of which is incorporated herein by reference in its entirety.

BACKGROUND

1. Field

Embodiments of the present invention relate to an organic light emitting diode display including a thin film organic layer.

2. Description of Related Art

An organic light emitting diode display (OLED display) is a self-emission type display device that displays an image using organic light emitting diodes (OLEDs) that emit light. The OLED display exhibits excellent properties such as low power consumption, high luminance, and high speed of response, and thus has drawn attention as a display device of the next generation.

The OLED generally includes an anode and a cathode, which are opposed to each other, with an organic layer disposed therebetween. Further, the organic layer includes an organic light emitting layer. Holes and electrons are respectively supplied from the anode and the cathode into an organic light emitting layer, and then combined with each other therein to form excitons. The OLED emits light by energy generated when the excitons fall from an excited state to a ground state.

A microcavity may be used to more efficiently extract light generated from the organic light emitting layer, thereby improving luminance efficiency. The microcavity utilizes a principle in which, when light is repeatedly reflected off a reflective layer (e.g., an anode electrode) and a transflective layer (e.g., a cathode electrode) that are a predetermined distance (i.e., an optical path length) apart from each other, a strong interference effect occurs between the reflected light so that light of a predetermined wavelength is amplified and light of other wavelengths is cancelled out. Accordingly, frontward color reproducibility and luminance of the OLED display are improved.

In order to bring about the microcavity effect, distances between the anode and cathode of red, green, and blue OLEDs are respectively determined according to red, green, and blue wavelengths, and a thickness of the organic layer disposed between the anode and the cathode is also determined according to the respective wavelengths. However, when the organic layer is thickly formed to achieve the microcavity effect, more organic materials are required, thereby increasing the manufacturing cost of OLED displays.

It is to be understood that this background of the technology section is intended to provide useful background for understanding the technology disclosed herein, and as such the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to an organic light emitting diode display including an organic layer having a reduced (e.g., small) thickness, thereby reducing manufacturing cost.

According to an embodiment of the present invention, an organic light emitting diode display includes: a substrate; and a plurality of red organic light emitting diodes, green organic light emitting diodes, and blue organic light emitting diodes on the substrate, each of the plurality of red organic light emitting diodes, green organic light emitting diodes, and blue organic light emitting diodes including: a first electrode on the substrate; an organic layer on the first electrode; and a second electrode on the organic layer, and the organic layer includes a light emission auxiliary layer on the first electrode and an organic light emitting layer on the light emission auxiliary layer, and the organic layer of each of the red organic light emitting diodes has a thickness of about 90 to 110 nm.

The light emission auxiliary layer of each of the red organic light emitting diodes may have a thickness of about 10 nm or less.

The organic light emitting layer of each of the red organic light emitting diodes may have a thickness of about 30 to 40 nm.

The light emission auxiliary layer of each of the green organic light emitting diodes may have a thickness of about 100 to 120 nm.

The organic light emitting layer of each of the green organic light emitting diodes may have a thickness of about 30 to 40 nm.

The light emission auxiliary layer of each of the blue organic light emitting diodes may have a thickness of about 80 to 100 nm.

The organic light emitting layer of each of the blue organic light emitting diodes may have a thickness of about 20 to 30 nm.

The organic layer may further include at least one of a hole transport layer and a hole injection layer between the first electrode and the light emission auxiliary layer.

The hole transport layer may have a thickness of about 30 to 40 nm.

The organic layer may further include at least one of an electron transport layer and an electron injection layer between the organic light emitting layer and the second electrode.

The organic light emitting diode display may further include a capping layer on the second electrode.

The capping layer may have a thickness of about 70 to 120 nm.

The organic layer of each of the green organic light emitting diodes may have a thickness of about 80 to 100 nm.

The light emission auxiliary layer of each of the green organic light emitting diodes may have a thickness of about 10 to 20 nm.

The organic light emitting layer of each of the green organic light emitting diodes may have a thickness of about 30 to 40 nm.

The organic layer may further include a hole transport layer between the first electrode and the light emission auxiliary layer, the hole transport layer having a thickness of about 10 to 20 nm.

The organic layer of each of the blue organic light emitting diodes may have a thickness of about 60 to 70 nm.

The light emission auxiliary layer of each of the blue organic light emitting diodes may have a thickness of about 10 nm or less.

The organic light emitting layer of each of the blue organic light emitting diodes may have a thickness of about 10 to 20 nm.

The organic layer may further include a hole transport layer between the first electrode and the light emission auxiliary layer, and the hole transport layer may have a thickness of about 10 to 20 nm.

According to embodiments of the present invention, an organic light emitting diode display includes an organic layer having a reduced (e.g., small) thickness, such that the manufacturing cost of the organic light emitting diode display can be reduced.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be simplified or exaggerated to better illustrate embodiments of the present invention and for clarity. Other elements present in an actual product may be omitted. Thus, the drawings are intended to facilitate the understanding of the present invention.

All terminologies used herein are merely used to describe embodiments of the present invention and may be modified according to the relevant art and the intention of an applicant. Therefore, the terms used herein should be interpreted as having a meaning that is consistent with their meanings in the context of the present disclosure, and are not intended to limit the invention.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The OLED display, driving circuit, and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the OLED display may be formed on one integrated circuit (IC) chip or on separate IC chips. Further, the various components of the OLED display may be implemented on a flexible printed circuit film, a tape carrier package (TCP), a printed circuit board (PCB), or formed on a same substrate as one another. Further, the various components of the OLED display may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Hereinafter, a first embodiment of the present invention will be described with reference to FIGS. 1 to 3.

Figure 1:
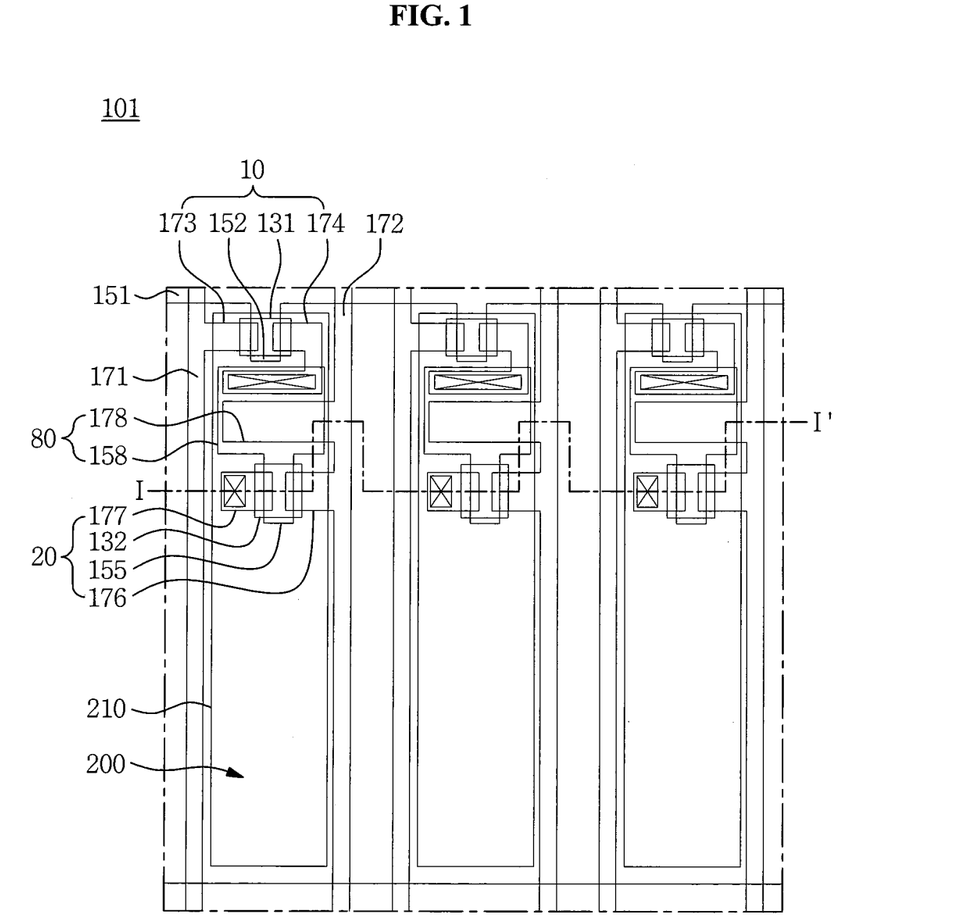
FIG. 1 is a plan view of an organic light emitting diode display (OLED display) according to an embodiment of the present invention.

FIG. 1 is a plan view of an organic light emitting diode display (hereinafter OLED display) according to an embodiment of the present invention. FIG. 2 is a cross-sectional view taken along line I-I' of FIG. 1.

Figure 2:
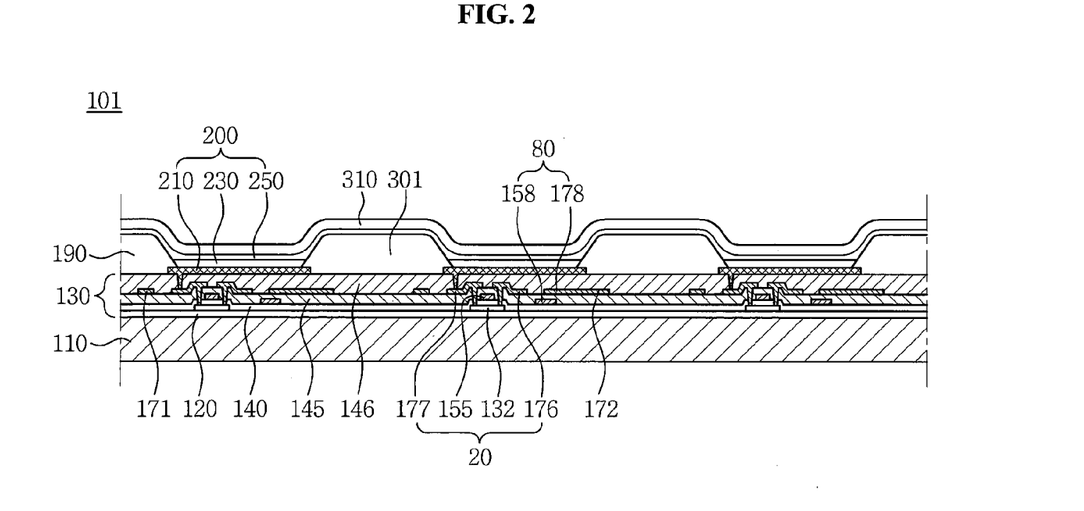
FIG. 2 is a cross-sectional view taken along line I-I' of FIG. 1.

Referring to FIGS. 1 and 2, an OLED display 101 according to an embodiment of the present invention includes a first substrate 110, a driving circuit unit 130, an organic light emitting diode (hereinafter OLED) 200, and a capping layer 310.

The first substrate 110 may be made of an insulative material selected from a group of glass, quartz, ceramic, plastic and the like, but is not limited thereto. In some embodiments, the first substrate 110 may be made of a metal material such as stainless steel and the like.

A buffer layer 120 is disposed on the first substrate 110. The buffer layer 120 may include one or more layers selected from a variety of inorganic and organic layers. According to an embodiment, the buffer layer 120 is configured to prevent or more efficiently reduce infiltration of undesirable elements such as impurities and moisture into the driving circuit unit 130 and the OLED 200, and to planarize a surface of the first substrate 110. However, the buffer layer 120 is not always necessary, and may be omitted in some embodiments.

The driving circuit unit 130 is disposed on the buffer layer 120. The driving circuit unit 130 includes a switching thin film transistor (hereinafter TFT) 10, a driving TFT 20, and a capacitor 80 and is configured drive the OLED 200. The OLED 200 emits light according to a driving signal supplied from the driving circuit unit 130 to display an image.

FIGS. 1 and 2 illustrate an active-matrix (AM)-type OLED display 101 having a 2Tr-1 Cap structure, which includes two TFTs 10 and 20 and a capacitor 80 in each pixel, but embodiments of the present invention are not limited thereto. In some embodiments, the OLED display 101 may have many different structures including three or more TFTs and two or more capacitors in one pixel, and may further include additional lines. Herein, the term "pixel" refers to the smallest unit for displaying an image, and the OLED display 101 displays an image using a plurality of pixels.

Each pixel includes the switching TFT 10, the driving TFT 20, the capacitor 80, and the OLED 200. In addition, a gate line 151 arranged along one direction and a data line 171 and a common power line 172 insulated from and intersecting the gate line 151 are also disposed on the driving circuit unit 130. Herein, each pixel may be defined by the gate, data, and common power lines 151, 171, and 172, but is not limited thereto. In some embodiments, pixels may be defined by a pixel defining layer PDL and/or a black matrix.

The OLED 200 includes a first electrode 210, an organic layer 230 formed on the first electrode 210, and a second electrode 250 formed on the organic layer 230. The organic layer 230 includes an organic light emitting layer 233 (refer to FIG. 3). A hole and an electron are respectively injected from the first and second electrodes 210 and 250 into the organic light emitting layer 233. The hole and the electron are combined with each other to form an exciton, and the OLED emits light by energy generated when the exciton falls from an excited state to a ground state.

The capacitor 80 includes a pair of capacitor plates 158 and 178 with an interlayer insulating layer 145 interposed therebetween. Herein, the interlayer insulating layer 145 may be a dielectric. Capacitance of the capacitor 80 may be determined by electric charges stored in the capacitor 80 and voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated by a gate insulating layer 140.

The switching TFT 10 functions as a switching element which selects a pixel to perform light emission. The switching gate electrode 152 is connected to the gate line 151 and the switching source electrode 173 is connected to the data line 171. The switching drain electrode 174 is spaced apart from the switching source electrode 173 and is connected to one capacitor plate 158.

The driving TFT 20 applies a driving power, which allows the organic light emitting layer 233 of the OLED 200 in a selected pixel to emit light, to the first electrode 210 serving as a pixel electrode. The driving gate electrode 155 is connected to the one capacitor plate 158 that is connected to the switching drain electrode 174. The driving source electrode 176 and another capacitor plate 178 are respectively connected to the common power line 172. The driving drain electrode 177 is connected to the first electrode 210 serving as a pixel electrode of the OLED 200 through a contact hole.

According to an embodiment, with the above-described structure, the switching TFT 10 is operated by a gate voltage applied to the gate line 151 and functions to transmit a data voltage applied to the data line 171 to the driving TFT 20. Voltage equivalent to a difference between a common voltage applied from the common power line 172 to the driving TFT 20 and the data voltage transmitted by (or from) the switching TFT 10 is stored in the capacitor 80, and current corresponding to the voltage stored in the capacitor 80 flows to the OLED 200 through the driving TFT 20, so that the OLED 200 may emit light.

According to an embodiment, the first electrode 210 is an anode serving as a hole injecting electrode and the second electrode 250 is a cathode serving as an electron injecting electrode. However, embodiments of the present invention are not limited thereto, and thus the first electrode 210 may function as a cathode, and the second electrode 250 may function as an anode.

According to an embodiment, the first electrode 210 forms a reflective layer and the second electrode 250 forms a transflective layer. Therefore, light generated from the organic light emitting layer 233 may be emitted through the second electrode 250. That is, the OLED display 101 according to an embodiment of the present invention may have a top-emission type structure.

A pixel defining layer 190 has an aperture. A part of the first electrode 210 is exposed through the aperture of the pixel defining layer 190. The first electrode 210, the organic layer 230, and the second electrode 250 are sequentially laminated in the aperture of the pixel defining layer 190. The second electrode 250 is also disposed on the pixel defining layer 190. Further, at least a part of the organic layer 230 is disposed on (and/or contacts) the pixel defining layer 190. Accordingly, the pixel defining layer 190 may define a light emission area.

A capping layer 310 is disposed on the second electrode 250. The capping layer 310 is configured to protect the OLED 200 and also to allow light generated from the organic layer 230 to be more efficiently released outwards.

Although not illustrated, a thin film encapsulation layer may be further disposed on the capping layer 310 in order to protect the OLED 200. The thin film encapsulation layer may have a structure where at least one organic layer and at least one inorganic layer are alternately disposed, thereby preventing infiltration of external air (e.g., moisture or oxygen) into the OLED 200.

Further, an encapsulation substrate may be disposed on the second electrode 250 and spaced apart from the second electrode 250. The encapsulation substrate may be made of a transparent material such as quartz, glass, ceramic, and plastics. The encapsulation substrate may be bonded to the substrate 110 and covers the OLED 200.

Figure 3:
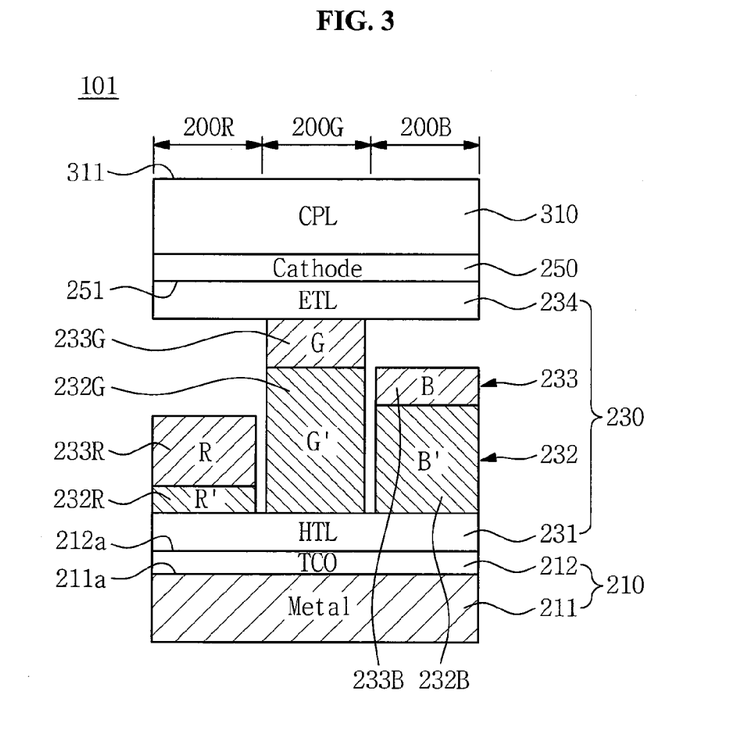
FIG. 3 is a schematic view illustrating the OLED display illustrated in FIG. 2.

FIG. 3 is a schematic view illustrating the OLED display 101 illustrated in FIG. 2.

The OLED display 101 according to an embodiment of the present invention includes red, green, and blue OLEDs 200R, 200G, and 200B.

The red, green, and blue OLEDs 200R, 200G, and 200B include the first electrode 210 on the substrate 110, the organic layer 230 on the first electrode 210, and the second electrode 250 on the organic layer 230. The organic layer 230 includes a light emission auxiliary layer 232 on the first electrode 210 and an organic light emitting layer 233 on the light emission auxiliary layer 232. Further, the organic layer 230 includes a hole transport layer 231 between the first electrode 210 and the light emission auxiliary layer 232 and an electron transport layer 234 between the organic light emitting layer 233 and the second electrode 250.

In the OLEDs 200R, 200G, and 200B of FIG. 3, the first electrode 210, the light emission auxiliary layer 232, and the organic light emitting layer 233 are separately formed for each of the corresponding OLEDs 200R, 200G, and 200B. In contrast, the hole transport layer 231, the electron transport layer 234, and the second electrode 250 are integrally laminated for all of the OLEDs 200R, 200G, and 200B.

According to an embodiment, the first electrode 210 is a reflective electrode including a reflective layer 211. In more detail, the first electrode 210 includes a reflective layer 211 including at least one metal of magnesium (Mg), silver (Ag), gold (Au), calcium (Ca), lithium (Li), chromium (Cr), copper (Cu) and aluminum (Al), and a transparent conductive layer 212 on the reflective layer 211.

The transparent conductive layer 212 may include transparent conductive oxides (TCO), that is, for example, at least one of indium tin oxides (ITO), indium zinc oxides (IZO), zinc oxides (ZnO), aluminum zinc oxides (AZO), and indium oxides ($In_2O_3$). The transparent conductive layer 212 may have a relatively high work function. When the first electrode 210 includes the transparent conductive layer 212, the hole injection through the first electrode 210 may be more efficiently carried out. Herein, an upper surface 212a of the transparent conductive layer 212 is an upper surface of the first electrode 210.

The reflective layer 211 may have a thickness of about 50 to 100 nm. The transparent conductive layer 212 may have a thickness of about 2 to 10 nm, for example, about 5 nm in thickness.

Further, the first electrode 210 may have a triple-layer structure where a transparent conductive layer, a reflective layer, and a transparent conductive layer are sequentially laminated.

The second electrode 250 may be formed of a transflective layer including one or more metals of magnesium (Mg), silver (Ag), gold (Au), calcium (Ca), lithium (Li), chromium (Cr), copper (Cu), and aluminum (Al). The second electrode 250 may have a thickness of about 5 to 20 nm. In some embodiments, the second electrode 250 may have a thickness of about 10 to 15 nm considering a trend toward thin elements and electron applying functions.

Light emitted from the organic light emitting layer 233 may pass through the second electrode 250, but may be reflected from a lower surface 251 of the second electrode 250. Therefore, light emitted from the organic light emitting layer 233 may repeat reflection between the upper surface 211a of the reflective layer 211 and the lower surface 251 of the second electrode 250.

The light emission auxiliary layers 232R, 232G, and 232B may include a hole transport material and may be made of the same material as the hole transport layer 231. Further, the light emission auxiliary layers 232R, 232G, and 232B of the red, green, and blue OLEDs 200R, 200G, and 200B may be made of the same material.

For example, the light emission auxiliary layers 232R, 232G, and 232B may include one or more of hole transport materials selected from a group consisting of N,N-dinaphthyl-N,N'-diphenyl benzidine (NPD), N,N'-bis-(3-methylphenyl)-N,N'-bis(phenyl)-benzidine (TPD), s-TAD and 4,4', 4"-Tris(N-3-methylphenyl-Nphenyl-amino)-triphenylamine (MTDATA).

Further, the light emission auxiliary layer 232 may include one or more of hole transport materials selected from a group consisting of N,N-dinaphthyl-N,N'-diphenyl benzidine (NPD), N,N'-bis-(3-methylphenyl)-N,N'-bis(phenyl)-benzidine (TPD), s-TAD and 4,4',4"-Tris(N-3-methylphenyl-Nphenyl-amino)-triphenylamine (MTDATA) and a p-type dopant doped on the hole transport material. Any p-type dopant used by and known to those skilled in the pertinent art may be used as the p-type dopant.

The electron transport layer 234 may be made of any electron transport material.

Although not illustrated, the organic layer 230 may further include a hole injection layer between the first electrode 210 and the hole transport layer 231, or may include only a hole injection layer instead of the hole transport layer 231. Further, the organic layer 230 may further include an electron injection layer between the electron transport layer 234 and the second electrode 250, or may include only an electron injection layer instead of the electron transport layer 234 (not illustrated).

The OLED 200 and the OLED display 101 have a multi-layer laminated structure, and most light emitted from the organic light emitting layer 233 may not pass through the multi-layer laminated structure and may not be released outwards. Accordingly, light attenuation may be caused in the OLED display.

According to an embodiment, in order to allow light emitted from the organic light emitting layer 233 to be more efficiently released outwards, a fine resonance structure is applied to the OLED 200. When light repeats reflection between the first electrode 210 that includes a reflective layer 211 and the second electrode 250 that is a transflective layer, light of a wavelength (e.g., a predetermined wavelength) corresponding to the reflection distance is amplified and light of other wavelengths is cancelled out. In this case, the amplified light may be released outwards through the second electrode 250 that is a transflective layer.

Figure 6:
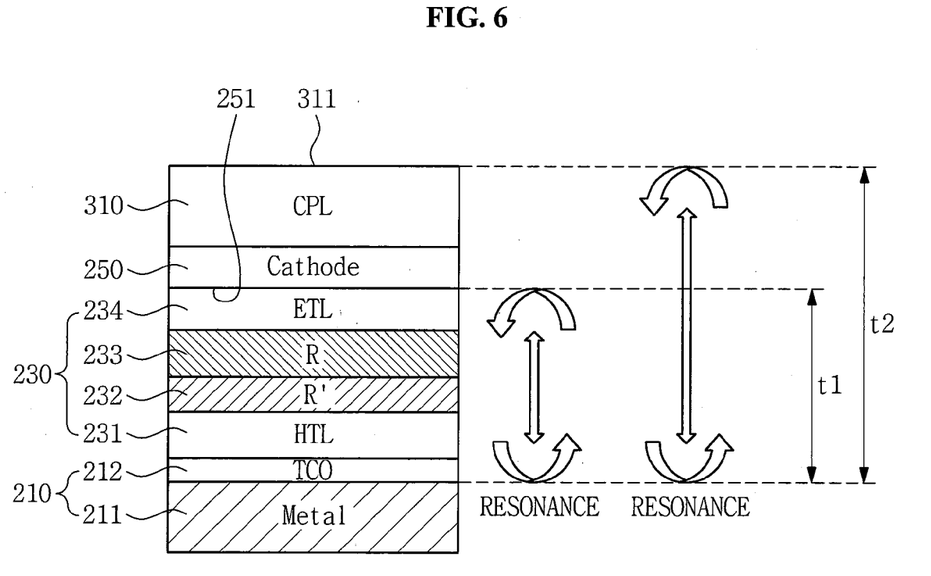
FIG. 6 is a concept view illustrating resonance caused in an organic light emitting diode (OLED)

FIG. 6 is a concept view illustrating resonance caused in the OLED.

As illustrated in FIG. 6, light resonance may occur between the reflective layer 211 of the first electrode 210 and the second electrode 250. Accordingly, resonance occurring between the first and second electrodes 210 and 250 of the OLED is called an inner resonance.

Further, when a refractive ratio difference between the capping layer 310 and a material on the capping layer is large, the upper surface 311 of the capping layer 310 functions as a transflective layer. Accordingly, light repeats reflection between the reflective layer 211 of the first electrode 210 and the upper surface 311 of the capping layer 310, thereby causing light resonance.

In order to cause the resonance, a distance t1 between the upper surface 211a of the reflective layer 211 and the lower surface 251 of the second electrode 250 and a distance t2 between the upper surface 211a of the reflective layer 211 and the upper surface 311 of the capping layer 310 may be adjusted corresponding to the respective colors.

Herein, the distance t1 between the upper surface 211a of the reflective layer 211 and the lower surface 251 of the second electrode 250 will be also called a distance t1 between the reflective layer 211 and the second electrode 250.

Figure 7:
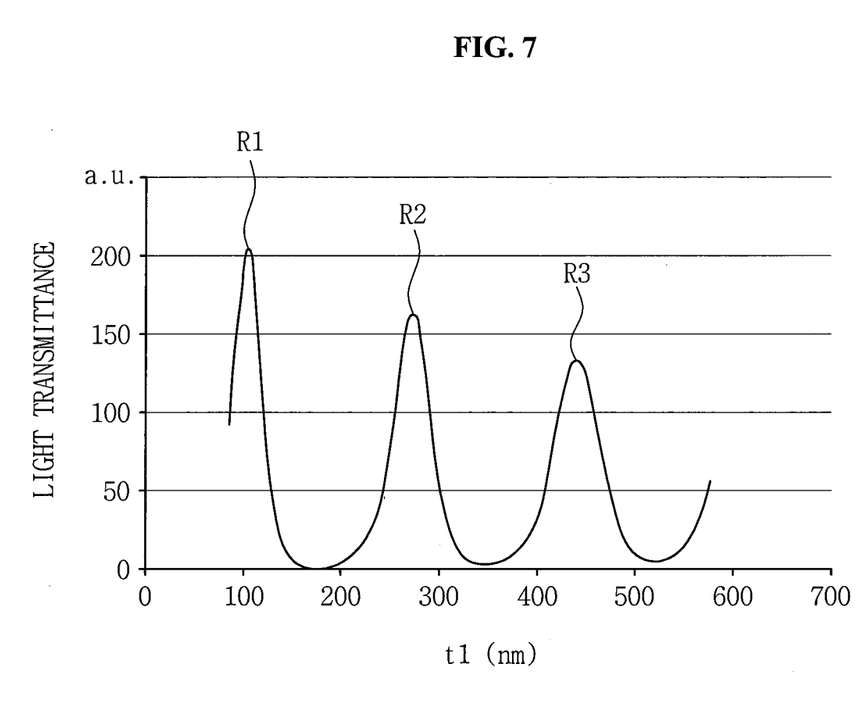
FIG. 7 is a graph illustrating light transmittance of a red OLED.

FIG. 7 is a graph illustrating light transmittance of a red OLED. Relative transmittance (a.u.) of red light emitted passing through the OLED is shown in FIG. 7, according to the distance t1 between the reflective layer 211 of the first electrode 210 and the second electrode 250. Provided that the transmittance is 100 when the resonance structure is not employed, the relative transmittance (a.u.) of red light refers to a relative transmittance compared to the transmittance of 100.

Referring to FIG. 7, when the distance t1 between the reflective layer 211 and the second electrode 250 is about 105 nm, 260 nm, and 440 nm, the transmittance of red light passing through the OLED 200 has peak points R1, R2, and R3. In more detail, when the distance t1 between the reflective layer 211 and the second electrode 250 is about 105 nm, the first peak R1 appears, when about 260 nm, the second peak R2 appears, and when about 440 nm, the third peak R3 appears. Herein, the first, second, and third peaks R1, R2, and R3 correspond to first, second, and third resonances.

Each layer forming the OLED may have a thickness larger than a minimum thickness that may serve each corresponding function. In consideration of the minimum thickness and efficacy of a thin film process, the OLED is generally designed so that the second resonance occurs between the reflective layer 211 of the first electrode 210 and the second electrode 250. Accordingly, the red OLED may be generally designed so that the distance t1 between the reflective layer 211 of the first electrode 210 and the second electrode 250 is about 260 nm.

In contrast, the OLED display 101 according to an embodiment of the present invention may have a structure where red light is subject to the first resonance between the reflective layer 211 of the red OLED 200R and the second electrode 250.

For this purpose, the red OLED 200R according to an embodiment of the present invention may be designed so that a distance between the reflective layer 211 and the second electrode 250 is about 95 to 115 nm.

Meanwhile, the transparent conductive layer 212 disposed on the reflective layer 211 of the first electrode 210 may have a thickness of about 2 to 10 nm, that is, for example, about 5 nm. Accordingly, the organic layer 230 disposed between the first and second electrodes 210 and 250 of the red OLED 200R may have a thickness of about 90 to 110 nm. For example, the organic layer 230 disposed between the first and second electrodes 210 and 250 of the red OLED 200R may have a thickness of about 95 to 105 nm, that is, for example, about 100 nm.

Referring to FIG. 3, a thickness of the organic layer 230 corresponds to the distance between the first and second electrodes 210 and 250, that is, in more detail, a distance between the upper surface 212a of the transparent conductive layer 212 and the lower surface 251 of the second electrode 250.

In one embodiment, the red organic light emitting layer 233R has a thickness of about 30 to 40 nm. When having a thickness of about 30 to 40 nm, the red organic light emitting layer 233R may emit light.

In one embodiment, the light emission auxiliary layer 232R of the red OLED 200R has a thickness less than 10 nm, for example, about 2 to 10 nm. When thicknesses of other layers forming the organic layer 230 vary, a thickness of the light emission auxiliary layer 232 may also vary. The light emission auxiliary layer 232 is configured to transport holes to the organic light emitting layer 233 and to adjust a thickness of the organic layer 230.

When the OLED 200 is accordingly designed to cause the first light resonance between the reflective layer 211 of the first electrode 210 and the second electrode 250, an amount of organic materials used for manufacturing the organic layer 230 can be reduced, compared to the case where the second resonance occurs between the reflective layer 211 of the first electrode 210 and the second electrode 250. Therefore, the manufacturing cost of the OLED display 101 may be reduced.

According to an embodiment of the present invention, green and blue OLEDs 200G and 200B may be designed so that the second resonance occurs between the reflective layer 211 of the first electrode 210 and the second electrode 250.

In the case of the green and blue OLEDs, according to an embodiment when the distances t1 between the reflective layer 211 of the first electrode 210 and the second electrode 250 are respectively about 225 nm and 185 nm, the second resonance occurs. Therefore, in the OLED display 101 according to an embodiment of the present invention, the green and blue OLEDs may be designed so that the distance between the reflective layer 211 of the first electrode 210 and the second electrode 250 are respectively about 225 nm and 185 nm. Considering that the transparent conductive layer 212 may have a thickness of about 5 nm, the organic layer 230 of the green and blue OELDs may respectively have thicknesses of about 220 nm and 180 nm.

In one embodiment the light emission auxiliary layer 232G of the green OLED 200G has a thickness of about 100 to 120 nm, and the green organic light emitting layer 233G has a thickness of about 30 to 40 nm.

In one embodiment the light emission auxiliary layer 232B of the blue OLED 200B has a thickness of about 80 to 100 nm, and the blue organic light emitting layer 233B has a thickness of about 20 to 30 nm.

In one embodiment the hole transport layer 231, which is a common layer, has a thickness of about 30 to 40 nm.

Further, according to an embodiment of the present invention, the upper surface 311 of the capping layer 310 may function as a transflective layer. Therefore, the OLED may be designed so that resonance may also occur between the reflective layer 211 of the first electrode 210 and the upper surface 311 of the capping layer 310, thereby improving light extraction efficiency of the OLED display 101.

In the red OLED 200R, when the distance t2 between the upper surface 211a of the reflective layer 211 and the upper surface 311 of the capping layer 310 is about two time as long as the distance t1 between the upper surface 211a of the reflective layer 211 and the second electrode 250, red light may be subject to resonance. For this purpose, the capping layer 310 may have a thickness of about 70 to 120 nm. However, the thickness of the capping layer 310 is not limited thereto.

The capping layer 310 may include at least one selected from a group consisting of tris-8-hydroxyquinoline aluminum (Alq3), ZnSe, 2,5-bis(6'-(2',2''-bipyridyl))-1,1-dimethyl-3,4-diphenylsilole, 4'-bis[N-(1-napthyl)-N-phenyl-amion]biphenyl (α-NPD), N,N'-diphenyl-N,N'-bis(3-methylphenyl)-1,1'-biphenyl-4,4'-diamine (TPD), and 1,1'-bis(di-4-tolylaminophenyl)cyclohexane (TAPC).

Generally, a capping layer 310-forming material is inexpensive compared to a material for forming the organic layer 230 of the OLED 200. Therefore, an amount of required high-priced organic material is reduced by reducing a distance between the first and second electrodes 210 and 250, and the thickness of the capping layer 310 that is made of a low-priced material is further adjusted, such that resonance can be caused between the reflective layer 211 of the first electrode 210 and the upper surface 311 of the capping layer 310.

Figure 4:
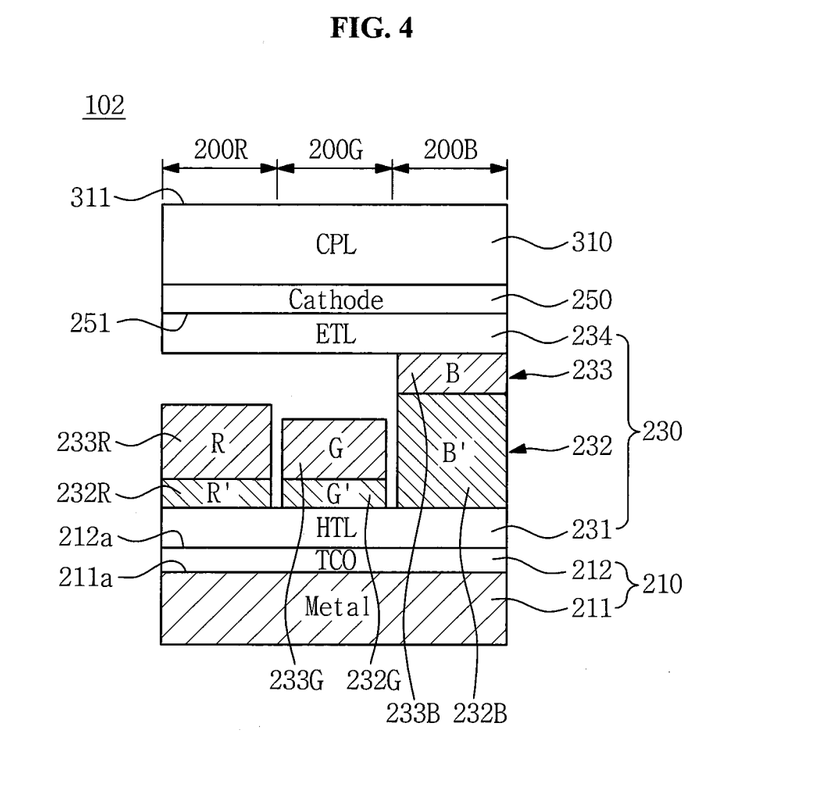
FIG. 4 is a schematic view illustrating an OLED display according to another embodiment of the present invention.

Hereinafter, another embodiment of the present invention will be described with reference to FIG. 4. FIG. 4 is a schematic view illustrating an OLED display 102 according to an embodiment of the present invention. The above-described elements of the previously described embodiment will be omitted to avoid repetition.

The OLED display 102 according to an embodiment of the present invention has a structure where green light is subject to the first resonance inside the green OLED 200G. That is, the first resonance of the green light occurs between the reflective layer 211 of the green OLED 200G and the second electrode 250.

For this purpose, the organic layer 230 of the green OLED 200G according to an embodiment of the present invention has a thickness of about 80 to 100 nm. For example, the organic layer 230 of the green OLED 200G may have a thickness of about 80 to 90 nm, for example, about 85 nm.

Further, in one embodiment the light emission auxiliary layer 232G of the green OLED 200G has a thickness of about 10 to 20 nm, and the green organic light emission layer 233G has a thickness of about 30 to 40 nm.

The hole transport layer 231 is integrally laminated for the red, green, and blue OLEDs 200R, 200G, and 200B and may have a thickness of about 10 to 20 nm.

A thickness of the hole transport layer 231 may vary.

When the hole transport layer 231 of the OLED display 102 according to an embodiment of the present invention has a thickness of about 10 to 20 nm, the light emission auxiliary layer 232R of the red OLED 200G may have a thickness of about 20 to 30 nm, and the light emission auxiliary layer 232B of the blue OLED 200B may have a thickness of about 100 to 120 nm.

In order to cause resonance between the reflective layer 211 of the first electrode 210 and the upper surface 311 of the capping layer 310, a thickness of the capping layer 310 may be adjusted. In some embodiments, the capping layer of the OLED display 102 according to an embodiment of the present invention may have a thickness of about 70 to 120 nm.

Figure 5:
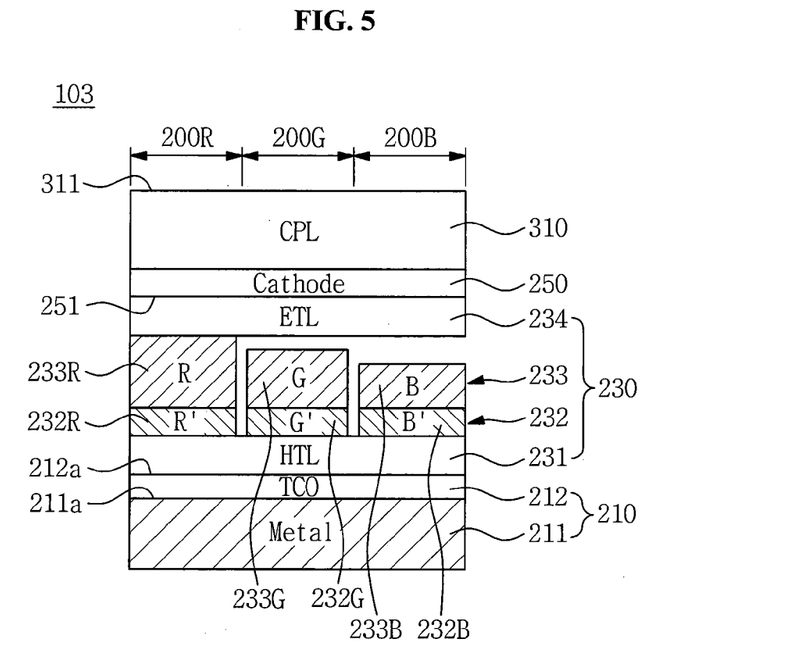
FIG. 5 is a schematic view illustrating an OLED display according to yet another embodiment of the present invention.

Hereinafter, another embodiment of the present invention will be described with reference to FIG. 5. FIG. 5 is a schematic view illustrating an OLED display according to an embodiment of the present invention. The above-described elements of the previously described embodiments will be omitted to avoid repetition.

The OLED display 103 according to an embodiment of the present invention has a structure where blue light is subject to the first resonance inside the blue OLED 200B. That is, the first resonance of the blue light occurs between the reflective layer 211 of the blue OLED 200B and the second electrode 250.

For this purpose, the organic layer 230 of the blue OLED 200B according to an embodiment of the present invention has a thickness of about 60 to 70 nm. For example, the organic layer 230 of the blue OLED 200B may have a thickness of about 60 to 65 nm.

Further, the light emission auxiliary layer 232B of the blue OLED 200B may have a thickness of about 10 nm or less, for example, about 2 to 10 nm. In one embodiment the blue organic light emitting layer 233B has a thickness of about 10 to 20 nm. In this case, the hole transport layer 231 may have a thickness of about 10 to 20 nm.

Further, the thickness of the capping layer 310 may be adjusted in order to secure a resonance distance between the first electrode 210 and the upper surface 311 of the capping layer 310. In some embodiments, the capping layer may have a thickness of about 70 to 120 nm.

From the foregoing, it will be appreciated that various embodiments in accordance with the present disclosure have been described herein for purposes of illustration, and it will be understood by those of skill in the art that various modifications may be made without departing from the scope and spirit of the present invention as set forth in the following claims and their equivalents. Additionally, any and all features of the embodiments disclosed herein can be combined in any suitable manner as those skilled in the art would appreciate. Accordingly, the various embodiments disclosed herein are not intended to be limiting of the true scope and spirit of the present teachings.

What is claimed is:

1. An organic light emitting diode display comprising:
a substrate; and
a plurality of organic light emitting diodes comprising red organic light emitting diodes, green organic light emitting diodes, and blue organic light emitting diodes on the substrate, each of the red organic light emitting diodes, green organic light emitting diodes, and blue organic light emitting diodes comprising:
a first electrode on the substrate;
an organic layer on the first electrode; and
a second electrode on the organic layer,
wherein the organic layer comprises a light emission auxiliary layer on the first electrode, an organic light emitting layer on the light emission auxiliary layer, and at least one of a hole transport layer and a hole injection layer between the first electrode and the light emission auxiliary layer, and the light emission auxiliary layer is configured to transport holes to the organic light emitting layer,
wherein the second electrodes of at least one of the red organic light emitting diodes, at least one of the green organic light emitting diodes, and at least one of the blue organic light emitting diodes are all integrally laminated as one continuous layer,
wherein the organic layer of each of the red organic light emitting diodes has a thickness of 90 to 110 nm, and
wherein a distance between an upper surface of a reflective layer of the first electrode and a lower surface of the second electrode in each of the red organic light emitting diodes corresponds to a first resonance of red light inside each of the red organic light emitting diodes.

2. The organic light emitting diode display of claim 1, wherein the light emission auxiliary layer of each of the red organic light emitting diodes has a thickness of 2 to 10 nm.

3. The organic light emitting diode display of claim 2, wherein the organic light emitting layer of each of the red organic light emitting diodes has a thickness of 30 to 40 nm.

4. The organic light emitting diode display of claim 1, wherein the light emission auxiliary layer of each of the green organic light emitting diodes has a thickness of 100 to 120 nm.

5. The organic light emitting diode display of claim 4, wherein the organic light emitting layer of each of the green organic light emitting diodes has a thickness of 30 to 40 nm.

6. The organic light emitting diode display of claim 1, wherein the light emission auxiliary layer of each of the blue organic light emitting diodes has a thickness of 80 to 100 nm.

7. The organic light emitting diode display of claim 6, wherein the organic light emitting layer of each of the blue organic light emitting diodes has a thickness of 20 to 30 nm.

8. The organic light emitting diode display of claim 1, wherein the hole transport layer has a thickness of 30 to 40 nm.

9. The organic light emitting diode display of claim 1, wherein the organic layer further comprises at least one of an electron transport layer and an electron injection layer between the organic light emitting layer and the second electrode.

10. The organic light emitting diode display of claim 1, further comprising a capping layer on the second electrode.

11. The organic light emitting diode display of claim 10, wherein the capping layer has a thickness of 70 to 120 nm.

12. The organic light emitting diode display of claim 1, wherein the organic layer of each of the green organic light emitting diodes has a thickness of 80 to 100 nm.

13. The organic light emitting diode display of claim 12, wherein the light emission auxiliary layer of each of the green organic light emitting diodes has a thickness of 10 to 20 nm.

14. The organic light emitting diode display of claim 12, wherein the organic light emitting layer of each of the green organic light emitting diodes has a thickness of 30 to 40 nm.

15. The organic light emitting diode display of claim 14, wherein the organic layer further comprises a hole transport layer between the first electrode and the light emission auxiliary layer, the hole transport layer having a thickness of 10 to 20 nm.

16. The organic light emitting diode display of claim 1, wherein the organic layer of each of the blue organic light emitting diodes has a thickness of 60 to 70 nm.

17. The organic light emitting diode display of claim 16, wherein the light emission auxiliary layer of each of the blue organic light emitting diodes has a thickness of 2 to 10 nm.

18. The organic light emitting diode display of claim 16, wherein the organic light emitting layer of each of the blue organic light emitting diodes has a thickness of 10 to 20 nm.

19. The organic light emitting diode display of claim 16, wherein the organic layer further comprises a hole transport layer between the first electrode and the light emission auxiliary layer, the hole transport layer having a thickness of 10 to 20 nm.

* * * * *